(12) United States Patent
Kondou et al.

(10) Patent No.: US 7,052,311 B2
(45) Date of Patent: May 30, 2006

(54) BALANCED TRANSMISSION CABLE CONNECTOR

(75) Inventors: Takahiro Kondou, Shinagawa (JP); Mitsuru Kobayashi, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 0 days.

(21) Appl. No.: 11/069,946

(22) Filed: Mar. 3, 2005

(65) Prior Publication Data

US 2006/0046569 A1    Mar. 2, 2006

(30) Foreign Application Priority Data

Aug. 31, 2004   (JP)   ............................. 2004-253119

(51) Int. Cl.
*H01R 12/24*   (2006.01)

(52) U.S. Cl. ...................... 439/497; 439/76.1; 439/610
(58) Field of Classification Search ................ 439/497, 439/579, 607, 608, 610, 76.1
See application file for complete search history.

(56) References Cited

U.S. PATENT DOCUMENTS

| | | | | |
|---|---|---|---|---|
| 5,190,471 | A * | 3/1993 | Barile et al. | 439/455 |
| 5,679,008 | A * | 10/1997 | Takahashi et al. | 439/76.1 |
| 5,931,692 | A * | 8/1999 | Medina | 439/497 |
| 6,129,581 | A * | 10/2000 | Lee | 439/497 |
| 6,716,057 | B1 * | 4/2004 | Wu | 439/497 |
| 6,916,198 | B1 * | 7/2005 | Wu et al. | 439/497 |
| 2002/0009906 | A1 * | 1/2002 | Akama et al. | 439/76.1 |

FOREIGN PATENT DOCUMENTS

JP        2003-59593        2/2003

* cited by examiner

*Primary Examiner*—Hien Vu
(74) *Attorney, Agent, or Firm*—Staas & Halsey LLP

(57) ABSTRACT

A disclosed balanced transmission cable connector includes a relay board having a wiring pattern extending from the upper face to the lower face through a via hole. Wire connection pads to output signals are disposed on the upper face of the relay board, and wire connection pads to input signals are disposed on the lower face of the relay board. Two wires of a pair wire are soldered to the wire connection pads disposed on the same face of the relay board. A ground layer inside the relay board shields between the soldered parts of the pair wire to transmit output signals and the soldered parts of the pair wire to transmit input signals.

6 Claims, 14 Drawing Sheets

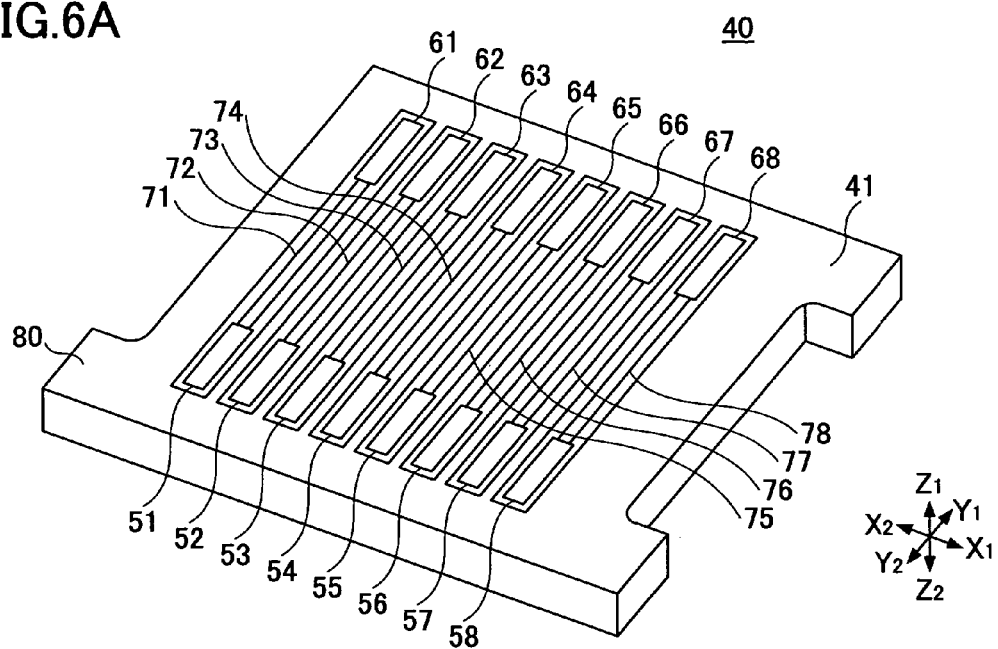
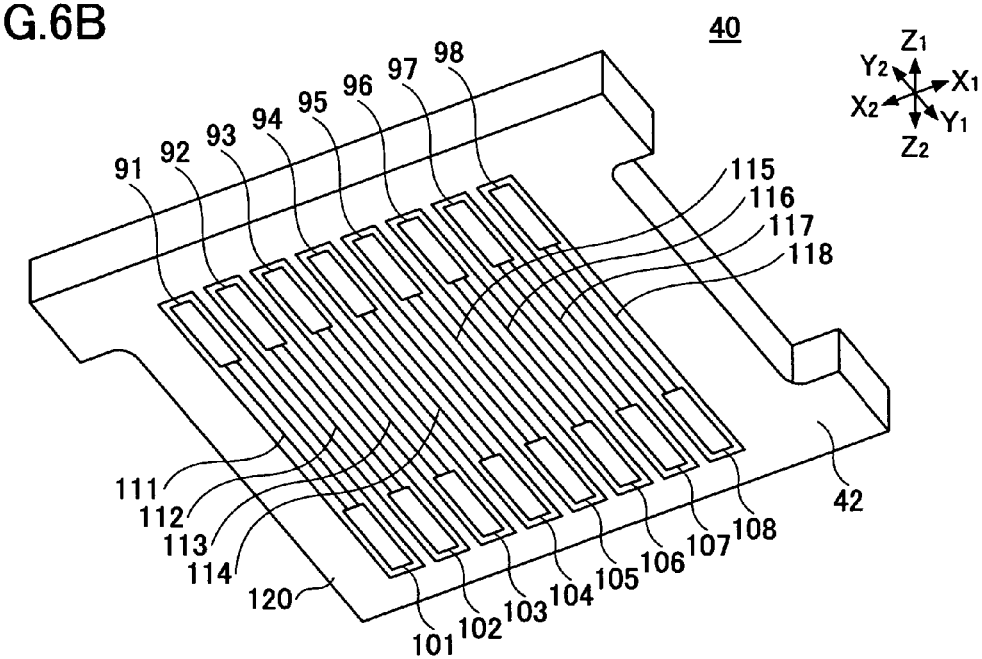

BALANCED TRANSMISSION CABLE CONNECTOR

BACKGROUND OF THE INVENTION

1. Field of the Invention

The present invention generally relates to a balanced transmission cable connector, and particularly relates to a balanced transmission cable connector having a contact assembly attached to an end of the cable through a relay board, a group of plural input contacts to input a signal and a group of plural output contacts to output a signal so as to reduce crosstalk between the input signal and the output signal.

2. Description of the Related Art

Data transmission is accomplished by two major methods. One is an imbalanced transmission method in which a single wire is used for every data element. The other one is a balanced transmission method in which two wires in pairs are used for every data element to simultaneously transmit a positive signal and a negative signal. The magnitudes of the positive signal and the negative signal are equal, and the transmission directions are opposite. The balanced transmission method has an advantage of being less affected by noise than the imbalanced transmission method, and therefore the balanced transmission is now increasingly used in high-speed signal transmission.

FIG. 1 is an illustration showing a balanced transmission cable connector 10 connecting a computer 1 and a server 2. The cable connector 10 includes a cable 11 having connector sections 12 and 20 one on each end thereof. The connector section 12 includes signal output contact pairs (1) through (4) and signal input contact pairs (5) through (8). Likewise, the connector section 20 includes signal output contact pairs (1) through (4) and signal input contact pairs (5) through (8).

A signal from the computer 1 is transmitted to the sever 2 via the signal output contact pairs (1) through (4) of the connector section 12, the cable 11, and the signal input contact pairs (5) through (8) of the connector section 20 with the balanced transmission method. A signal from the server 2 is transmitted to the computer 1 via the signal output contact pairs (1) thorough (4) of the connector section 20, the cable 11, and the signal input contact pairs (5) through (8) of the connector section 12 with the balanced transmission method.

Crosstalk is likely to occur between an input signal transmission line and an output signal transmission line adjacent thereto.

FIGS. 2A through 4 are illustrations each showing a part of a related-art balanced transmission cable connector 30 of a type disclosed, for example, in Japanese Patent Laid-Open Publication No. 2003-059593. Lines X1–X2, Y1–Y2 and Z1–Z2 respectively indicate the width direction of the cable connector 30, the longitudinal direction thereof and the height direction thereof. Y1 and Y2 respectively indicate the rear side and the front side. When referring to arrangement of contacts, the lines Z1–Z2 and X1–X2 respectively indicate the column direction and the row direction. FIG. 2A is a top perspective view of the cable connector 30, and FIG. 2B is a bottom perspective view of the cable connector 30. FIG. 3 is a side elevational view showing the cable connector 30, and FIG. 4 is an illustration showing a cable connected to an end of a relay board 40.

The cable connector 30 has a contact assembly 31, the relay board 40, a balanced transmission cable 130, and a shield cover 150.

FIG. 5 is a partly exploded perspective view showing the contact assembly 31. In FIG. 5, the contact assembly 31 has an electrical insulating block body 32. The block body 32 includes plural first and second signal contacts 33 and 34 and plural plate ground contacts 35 therein. The first signal contacts 33 are respectively paired with the second signal contacts 34 in the column direction (Z1-Z2 direction). The plural pairs of first and second signal contacts 33 and 34 and the plural ground contacts 35 are alternately arranged at regular intervals P in the row direction (X1-X2). The block body 32 has a plug body section 32a projecting toward the Y2 side. The plug body section 32a has an array of grooves. The first and second signal contacts 33 and 34 respectively have first and second signal contact sections 33a and 34a and first and second finger sections 33b and 34b. The ground contact 35 has a ground contact section 35a and a fork section 35b. The first and second signal contacts 33 and 34 and the ground contacts 35 are incorporated in the block body 32, just like being inserted from the Y1 side toward the Y2 direction. The first signal contact sections 33a are disposed on the upper face of the plug body section 32a and the second signal contact sections 34a are disposed on the lower face of the plug body section 32a. Upper and lower edges of each ground contact section 35a are respectively exposed on the upper and lower faces of the plug body section 32a. The first and second finger sections 33b and 34b and the fork sections 35b are so disposed to project to the Y1 side of the block body 32.

Two signal contacts form a contact pair. The contact assembly 31 has eight contact pairs (1) through (8) arranged in order. The contact pairs (1) through (8) are a group of signal output contact pairs (1) through (4) and a group of signal input contact pairs (5) to (8).

FIGS. 6A and 6B are illustrations of the relay board 40. As shown in FIGS. 6A and 6B, the relay board 40 is a generally square-shaped multilayer board having a ground layer (not shown) inside. The relay board 40 has, on an upper face 41 at the Z1 side, contact connection pads 51 through 58 arranged along the edge at the Y2 side, wire connection pads 61 through 68 arranged along the edge at the Y1 side, parallelly-arranged wiring patterns 71 through 78 respectively extending in the Y1-Y2 direction for connecting the contact connection pads 51 through 58 and the wire connection pads 61 through 68, and a ground pattern 80 covering the rest of the surface of the upper face 41. The ground pattern 80 shields between adjacent contact connection pads, between adjacent wiring patterns and between adjacent wire connection pads. The relay board 40 also has, on a lower face 42 at the Z2 side, contact connection pads 91 through 98 arranged along the edge of the Y2 side, wire connection pads 101 through 108 arranged along the edge of the Y1 side, parallelly-arranged wiring patterns 1111 through 118 extending in the Y1-Y2 direction for connecting the contact connection pads 91 through 98 and the wire connection pads 101 through 108, and a ground pattern 120 covering the rest of the surface of the lower face 42. The ground pattern 120 shields between adjacent contact connection pads, between adjacent wiring patterns and between adjacent wire connection pads.

FIGS. 7A and 7B are illustrations each showing the balanced transmission cable 130. As shown in FIG. 7A, the cable 130 has a double-shielded structure, having an outer shield 137, a shield wire mesh 138, and eight pair wires 141 through 148 arranged therein. Referring to FIG. 7B, each of the pair wires 141 through 148 comprises a pair of first and second shielded signal wires 132-1 and 132-2 and a drain wire 136 bundled and shielded by a metal tape 135 spirally wound thereon. The first and second shielded signal wires 132-1 and 132-2 and the drain wire 136 are outwardly extending from the end of each of the pair wires 141 through 148. The ends of the first and second shielded signal wires 132-1 and 132-2 are processed so as to expose bare first and second signal wires 133-1 and 133-2 by removing electrical insulating shields 134-1 and 134-2, respectively. The first and second signal wires 133-1 and 133-2 form a pair line. The end of the cable 130 is caulked by a clam member (not shown).

Referring back to FIGS. 2A through 3, the Y2 side end of the relay board 40 is fitted in the Y1 side of the contact assembly 31. The contact connection pads 51 through 58 are soldered to the first finger sections 33b of the first signal contacts 33, and the contact connection pads 91 through 98 are soldered to the second finger sections 34b of the second signal contacts 34. A part of each of the ground patterns 80 and 120 is soldered to the fork sections 35b of the ground contacts 35. In this way, the wire connection pads 61 and 101 are connected to the signal output contact pair (1); the wire connection pads 62 and 102 are connected to the signal output contact pair (2); the wire connection pads 63 and 103 are connected to the signal output contact pair (3); the wire connection pads 64 and 104 are connected to the signal output contact pair (4); the wire connection pads 65 and 105 are connected to the signal input contact pair (5); the wire connection pads 66 and 106 are connected to the signal input contact pair (6); the wire connection pads 67 and 107 are connected to the signal input contact pair (7); and the wire connection pads 68 and 108 are connected to the signal input contact pair (8).

The pair wires 141 through 148 at the end of the cable 130 are aligned in the X1-X2 direction. The first and second signal wires 133-1 and 113-2 extending out of an end of respective pair wires 141 through 148 are soldered to the Y1 side end of the relay board 40. The first and second signal wires 133-1 and 133-2 of the pair wires 141 through 148 are respectively arranged on the upper and lower sides of the end of the relay board 40. As shown in FIG. 4, the first signal wires 133-1 are soldered to the wire connection pads 61 through 68 with solders 160, and the second signal wires 133-2 are soldered to the wire connection pads 101 through 108 with solders 161. The drain wires 136 are soldered to the ground pattern 80 or 120. The ends of the pair wires 141 through 148 are arranged as shown in FIG. 4.

The contact pair (1) of the contact assembly 31 is electrically connected to the pair wire 141 through the contact connection pads 51 and 91, the wiring patterns 71 and 111, and the wire connection pads 61 and 101. The contact pair (2) of the contact assembly 31 is electrically connected to the pair wire 142 through the contact connection pads 52 and 92, the wiring patterns 72 and 112, and the wire connection pads 62 and 102. The contact pair (3) of the contact assembly 31 is electrically connected to the pair wire 143 through the contact connection pads 53 and 93, the wiring patterns 73 and 113, and the wire connection pads 63 and 103. The contact pair (4) of the contact assembly 31 is electrically connected to the pair wire 144 through the contact connection pads 54 and 94, the wiring patterns 74 and 114, and the wire connection pads 64 and 104. The contact pair (5) of the contact assembly 31 is electrically connected to the pair wire 145 through the contact connection pads 55 and 95, the wiring patterns 75 and 115, and the wire connection pads 65 and 105. The contact pair (6) of the contact assembly 31 is electrically connected to the pair wire 146 through the contact connection pads 56 and 96, the wiring patterns 76 and 116, and the wire connection pads 66 and 106. The contact pair (7) of the contact assembly 31 is electrically connected to the pair wire 147 through the contact connection pads 57 and 97, the wiring patterns 77 and 117, and the wire connection pads 67 and 107. The contact pair (8) of the contact assembly 31 is electrically connected to the pair wire 148 through the contact connection pads 58 and 98, the wiring patterns 78 and 118, and the wire connection pads 68 and 108. In short, the pair wires 141 through 144 are respectively connected to the signal output contact pairs (1) through (4), and the pair wires 145 through 148 are respectively connected to the signal input contact pairs (5) through (8).

In the cable connector 30, a signal transmission line of the signal output contact pair (4) is adjacent to a signal transmission line of the signal input contact pair (5). The signal transmission line of the signal output contact pair (4) and the signal transmission line of the signal input contact pair (5) are shielded by the ground contact 35 when in the contact assembly 31, and shielded by the ground patterns 80 and 120 when on the relay board 40. However, the first and second signal wires 133-1 and 133-2 at the end of the pair wire 144 soldered to the relay board 40 are not shielded from the first and second signal wires 133-1 and 133-2 at the end of the pair wire 145 soldered to the relay board 40. Therefore, crosstalk as shown with the arrows 170 and 171 possibly occurs at these non-shielded parts.

SUMMARY OF THE INVENTION

A general object of the present invention is to provide a balanced transmission cable connector to overcome the drawback described above. A specific object of the present invention is to provide a balanced transmission cable connector with reduced crosstalk.

To achieve these and other objects, the present invention provides a balanced transmission cable connector comprising, a contact assembly having an electrical insulating block body, and a group of contacts forming plural signal input contact pairs to input signals and a group of contacts forming plural signal output contact pairs to output signals arranged in the block body so as to allow balanced transmission, a cable having plural shielded pair wires each pair wire having two wires extending out of an end thereof, and a relay board mounted on the rear side of the contact assembly, having contact connection pads on an upper face thereof and contact connection pads paired therewith on a lower face thereof that are arranged at one side and are respectively connected to the contacts, wire connection pads that are arranged at the other side and are respectively connected to the wires extending out of the end of the respective pair wires of the cable, a wiring pattern to connect the contact connection pads and the wire connection pads, and a ground layer therein side, wherein the wiring pattern is formed in a fan shape spreading from the side where the contact connection pads are arranged to the side where the wire connection pads are arranged, the wire connection pads connected through the contact connection pads to the signal output contact pairs are disposed side by side on either one of the upper face or the lower face of the relay board, and the wire connection pads connected through the contact connection pads to the signal input contact pairs are disposed side by side on the other face of the relay board, the two wires of the respective pair wires are connected to a pair of the signal output wire connection pads disposed side by side or a pair of the signal input wire connection pads disposed side by side, and the ground layer inside the relay board is configured to shield between the wires connected to the signal output wire connection pads and the wires connected to the signal input wire connection pads.

According to the present invention, the ground layer inside the relay board can shield between a bare part of the wire to transmit an output signal and a bare part of the wire to transmit an input signal line. Therefore, without using additional components, crosstalk between the output signal and the input signal is minimized only by changing the wiring pattern of the relay board.

BRIEF DESCRIPTION OF THE DRAWINGS

FIGS. 6A and 6B are perspective views each showing the relay board;

DETAILED DESCRIPTION OF THE PREFERRED EMBODIMENT

Embodiments of the present inventions are described below.

[Embodiment 1]

Figure 8:
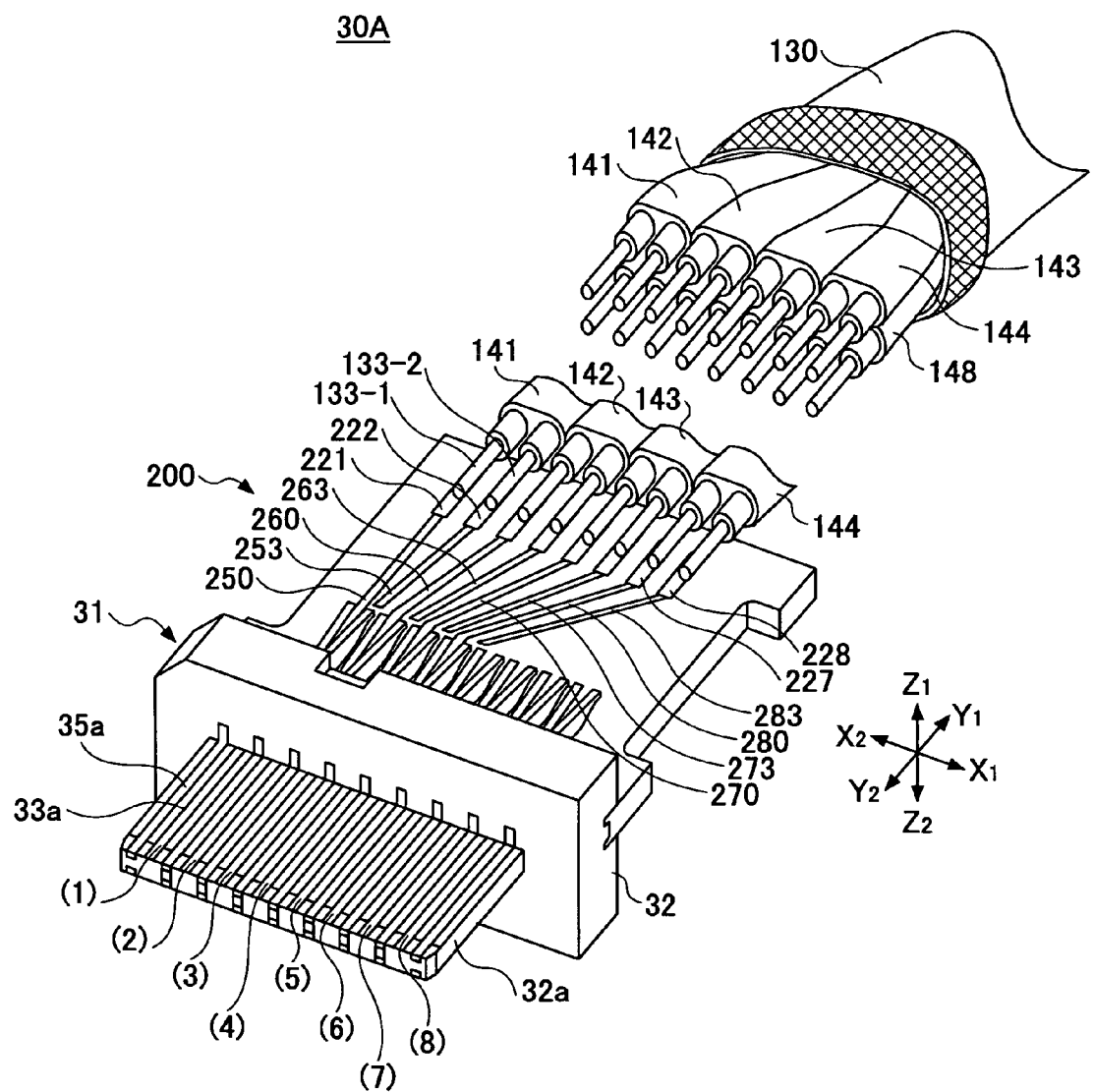
FIG. 8 is a perspective view showing a balanced transmission cable connector with a shield cover removed according to an embodiment 1 of the present invention.
Figure 9:
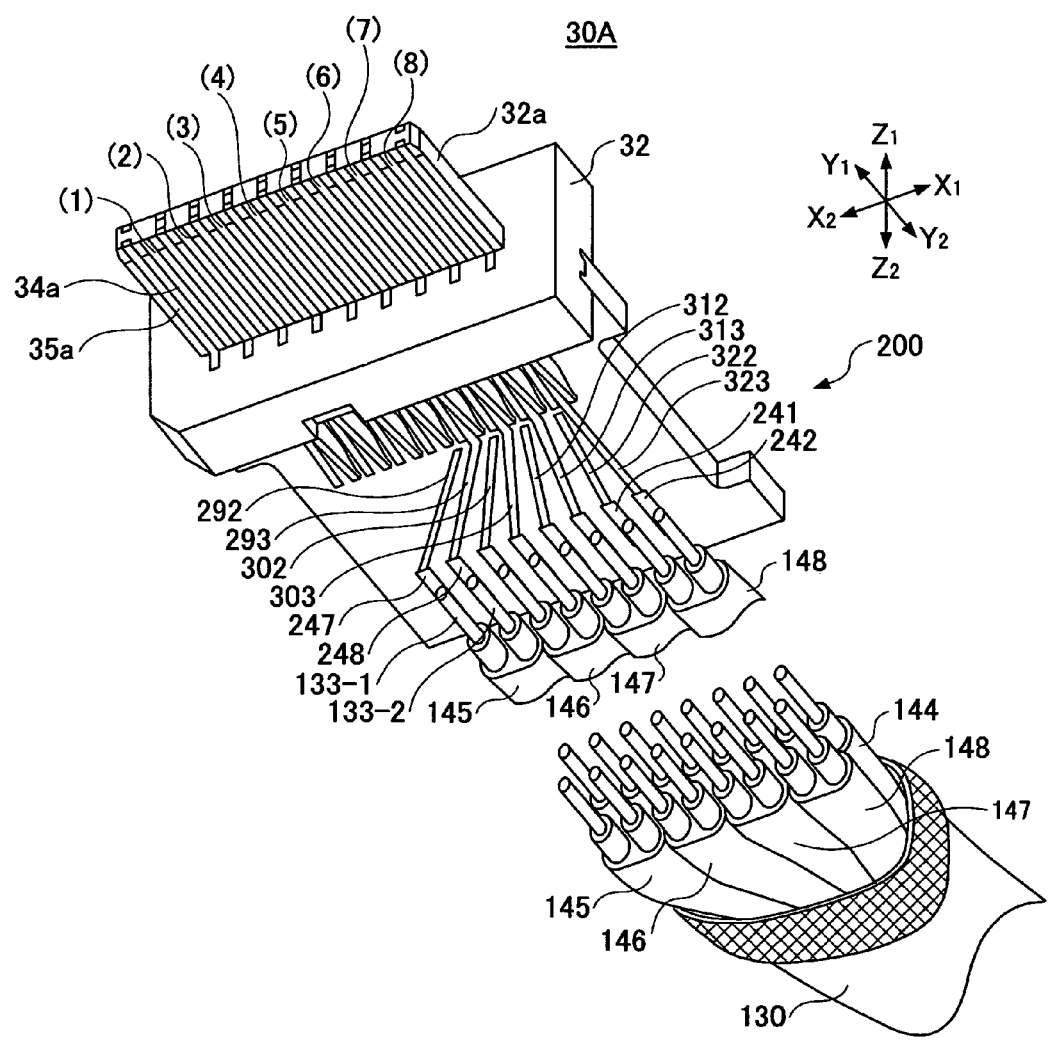
FIG. 9 is a bottom perspective view of the balanced transmission cable connector of FIG. 8.
Figure 10:
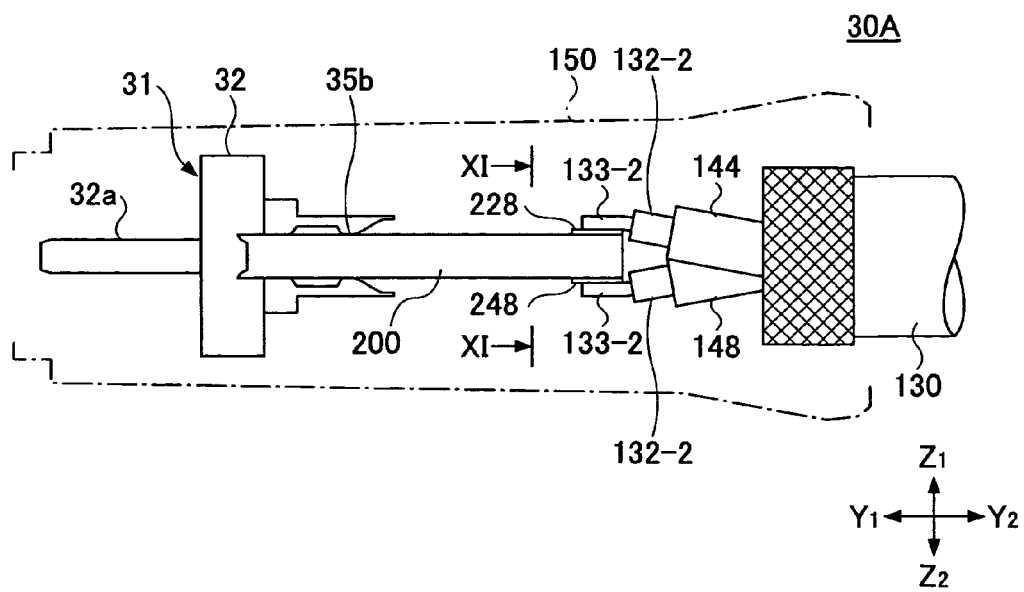
FIG. 10 is a side elevational view showing the balanced transmission cable connector of FIG. 8.
Figure 11:
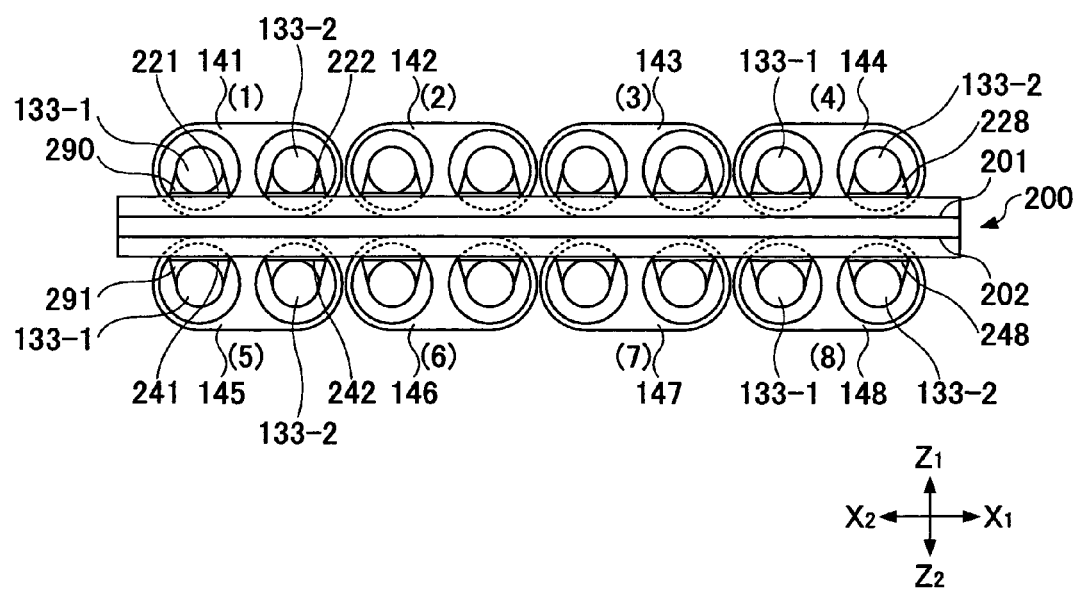
FIG. 11 is a cross-sectional view taken along line XI—XI in FIG. 10, showing pair wires arranged in line and connected to a relay board.

FIGS. 8 through 10 show a part of a balanced transmission cable connector 30A according to an embodiment 1 of the present invention. Lines X1–X2, Y1–Y2 and Z1–Z2 respectively indicate the width direction of the cable connector 30A, the longitudinal direction thereof and the height direction thereof. Y1 and Y2 respectively indicate the rear side and the front side. When referring to arrangement of contacts, the lines Z1–Z2 and X1–X2 respectively indicate the column direction and the row direction. FIG. 8 is a top perspective view of the cable connector 30A, and FIG. 9 is a bottom perspective view of the cable connector 30A. FIG. 10 is a side elevational view showing the cable connector 30A. FIG. 11 is an illustration showing a cable connected to an end of a relay board 200.

In FIGS. 8 through 11, the components corresponding to those in FIGS. 2A through 4 are denoted by the same reference numerals.

The cable connector 30A is substantially the same as the cable connector 30 shown in FIGS. 2A through 4, and the same elements are denoted by the same reference numerals. The configuration of the relay board 200 and the layout of pair wires 141 through 148 are, however, different from those of the cable connector 30.

The cable connector 30A has a contact assembly 31, the relay board 200, a balanced transmission cable 130, and a shield cover 150.

This contact assembly 31 is substantially the same as the related-art contact assembly 31. The same elements are denoted by the same reference numerals, and are not further described. The contact assembly 31 has eight contact pairs (1) through (8) arranged in order. The contact pairs (1) through (8) are a group of signal output contact pairs (1) through (4) and a group of signal input contact pairs (5) through (8).

Figure 12:
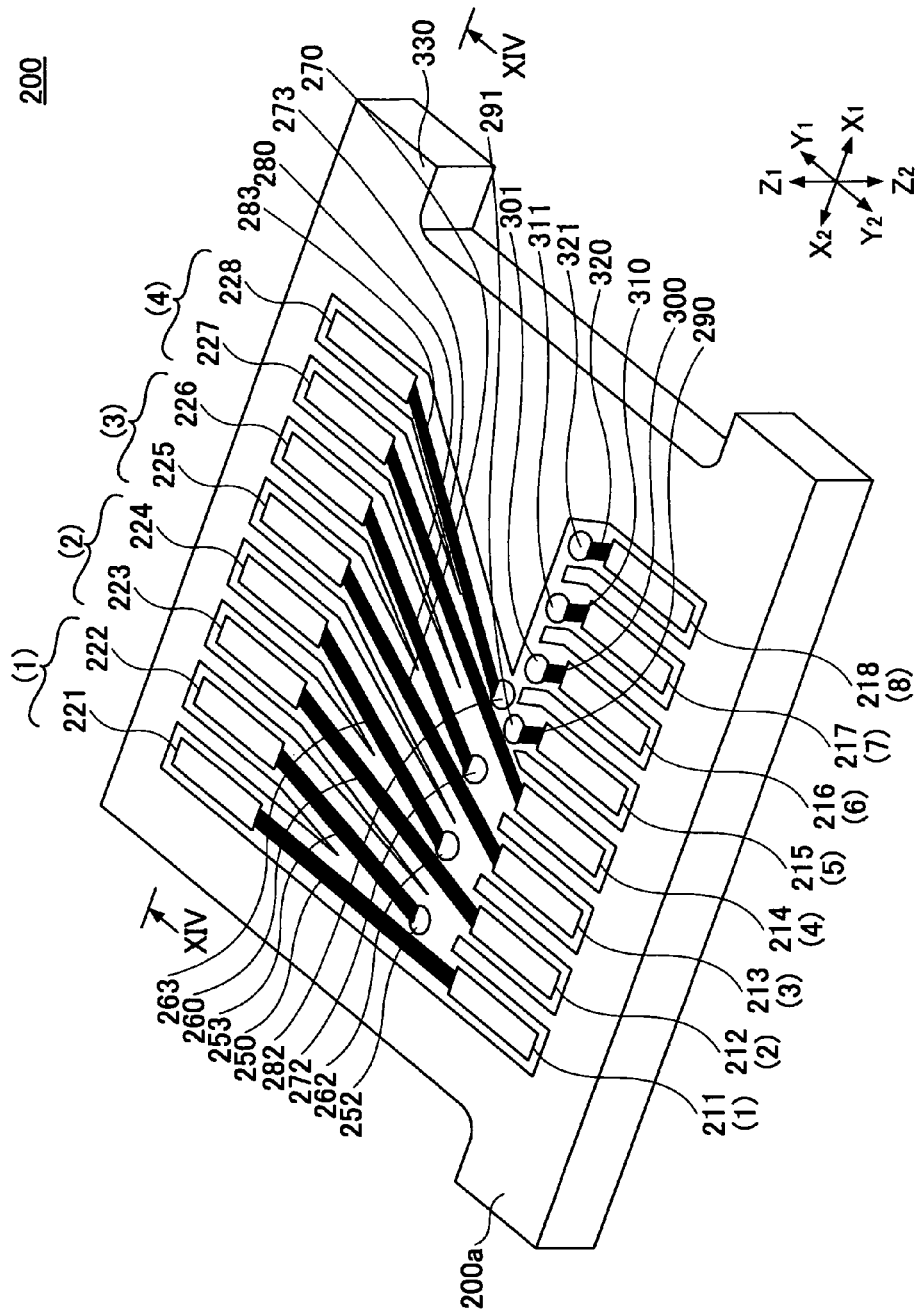
FIG. 12 is a top perspective view of the relay board.
Figure 13:
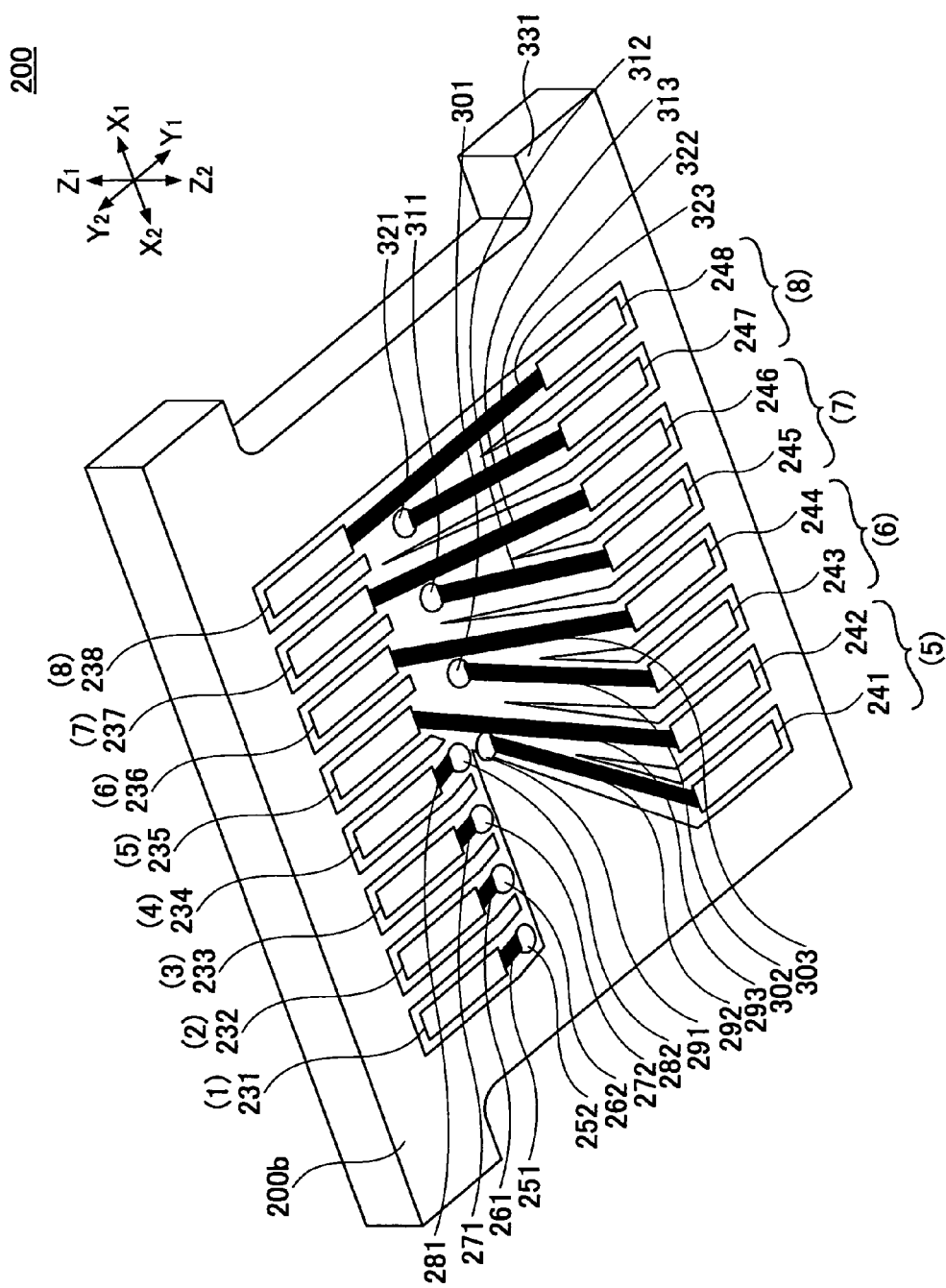
FIG. 13 is a bottom perspective view of the relay board.
Figure 14:
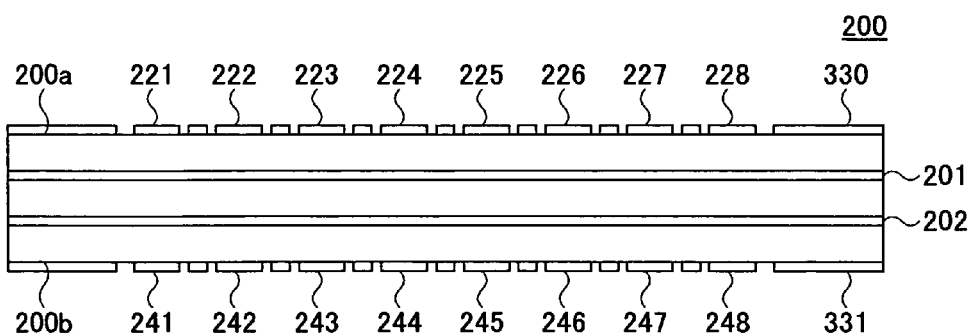
FIG. 14 is a cross-sectional view taken along line XIV—XIV in FIG. 12, showing the relay board.

FIGS. 12 through 14 are illustrations of the relay board 200. The relay board 200 is different from the relay board 40 shown in FIGS. 6A and 6B in formation of pairs of wire connection pads and in layout of wiring patterns associated therewith. At the Y2 side, like those on the relay board 40 shown in FIGS. 6A and 6B, contact connection pads on the upper face are respectively paired with contact connection pads on the lower face to correspond to contact pairs. At the Y1 side, on the other hand, adjacent wire contact pads on the same face are paired to correspond to the contact pairs. Also, wire connection pad pairs (1) through (4) on the upper face correspond to the signal output contact pairs (1) through (4), and wire connection pad pairs (5) through (8) on the lower face correspond to the signal input contact pairs (5) through (8). The wiring patterns are so formed that a pair formed on the upper and lower faces is transformed to a pair formed on the same face.

The relay board 200 is a generally square-shaped multi-layer board having two ground layers 201 and 202 inside as shown in FIG. 14.

Referring to FIG. 12, the relay board 200 has, on the upper face 200a at the Z1 side, contact connection pads 211 through 218 arranged along the edge at the Y2 side, and wire connection pads 221 through 228 arranged along the edge at the Y1 side. Referring to FIG. 13, the relay board 200 has, on the lower face 200b at the Z2 side, contact connection pads 231 through 238 arranged along the edge at the Y2 side, and wire connection pads 241 through 248 arranged along the edge at the Y1 side.

Wiring patterns and via holes are formed so as to connect the contact connection pads and the wire connection pads in the following manner.

Signal output contact pair (1):

contact connection pad 211-wiring pattern 250-wire connection pad 221 contact connection pad 231-wiring pattern 251-via hole 252-wiring pattern 253-wire connection pad 222

Signal output contact pair (2)
  contact connection pad 212-wiring pattern 260-wire connection pad 223
  contact connection pad 232-wiring pattern 261-via hole 262-wiring pattern 263-wire connection pad 224
Signal output contact pair (3):
  contact connection pad 213-wiring pattern 270-wire connection pad 225
  contact connection pad 233-wiring pattern 271-via hole 272-wiring pattern 273-wire connection pad 226
Signal output contact pair (4):
  contact connection pad 214-wiring pattern 280-wire connection pad 227
  contact connection pad 234-wiring pattern 281-via hole 282-wiring pattern 283-wire connection pad 228
Signal input contact pair (5):
  contact connection pad 215-wiring pattern 290-via hole 291-wiring pattern 292-wire connection pad 241
  contact connection pad 235-wiring pattern 293-wire connection pad 242
Signal input contact pair (6):
  contact connection pad 216-wiring pattern 300-via hole 301-wiring pattern 302-wire connection pad 243
  contact connection pad 236-wiring pattern 303-wire connection pad 244
Signal input contact pair (7):
  contact connection pad 217-wiring pattern 310-via hole 311-wiring pattern 312-wire connection pad 245
  contact connection pad 237-wiring pattern 313-wire connection pad 246
Signal input contact pair (8):
  contact connection pad 218-wiring pattern 320-via hole 321-wiring pattern 322-wire connection pad 247
  contact connection pad 238-wiring pattern 323-wire connection pad 248

Ground patterns 330 and 331 are formed to cover the area around the pads and wiring patterns and the areas between adjacent pads and between adjacent wiring patterns on the upper face 200a and the lower face 200b of the relay board 200, respectively.

The wiring patterns 250, 251 and 253, etc., are arranged to form a fan shape spreading from the contact connection pads 211, etc., to the wire connection pads 221, etc., without crossing with each other on the same face. The wiring patterns 250, 251 and 253, etc., comprise first wiring patterns extending only on the upper face 200a or only on the lower face 200b of the relay board 200 and second wiring patterns extending on both of the upper face 200a and lower face 200b of the relay board 200 through the via holes 252, etc.

The wire connection pads 221 and 222 form a wire connection pad pair (1); the wire connection pads 223 and 224 form a wire connection pad pair (2); the wire connection pads 225 and 226 form a wire connection pad pair (3); and the wire connection pads 227 and 228 form a wire connection pad pair (4). The wire connection pads 241 and 242 form a wire connection pad pair (5); the wire connection pads 243 and 244 form a wire connection pad pair (6); the wire connection pads 245 and 246 form a wire connection pad pair (7); and the wire connection pads 247 and 248 form a wire connection pad pair (8). The wire connection pad pairs (1) through (4) are arranged on the upper face 200a of the relay board 200, while the wire connection pad pairs (5) through (8) are arranged on the lower face 200b of the relay board 200. The wire connection pad pairs (1) through (4) are arranged from the X2 side to the X1 side in the same order as the signal output contact pairs (1) through (4). The wire connection pad pairs (5) through (8) are arranged from the X2 side to the X1 side in the same order as the signal output contact pairs (5) through (8) as well as the wire connection pad pairs (5) through (8).

Figure 7A:
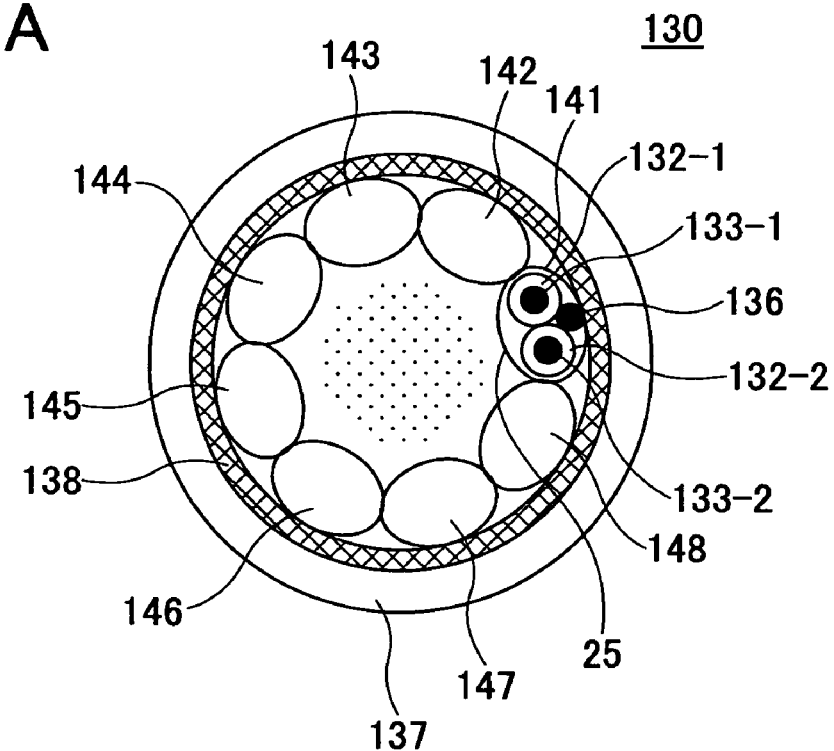
FIGS. 7A and 7B are illustrations each showing a balanced transmission cable.
Figure 7B:
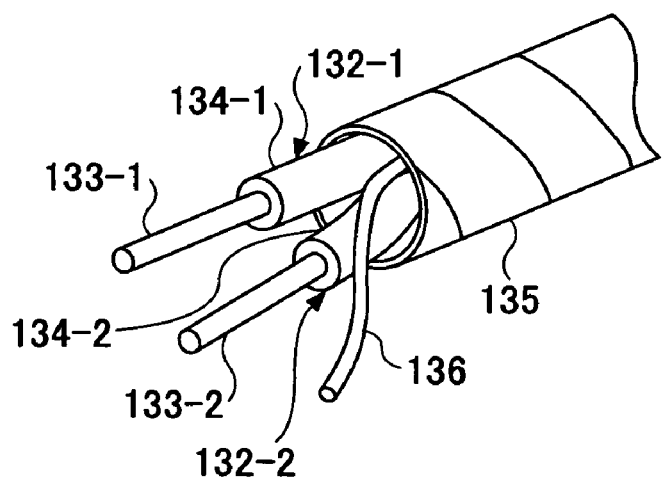

The cable 130 is the same as the cable 130 in FIGS. 7A and 7B. The pair wires 141 through 144 are arranged on the Z1 side in the X1-X2 direction, while the pairs wires 145 through 148 are arranged on the Z2 side in the X1-X2 direction (FIG. 8). Each of the pair wires 141 through 148 is so oriented that the first and second signal wires 133-1 and 133-2 are arranged in the X1-X2 direction.

Figure 5:
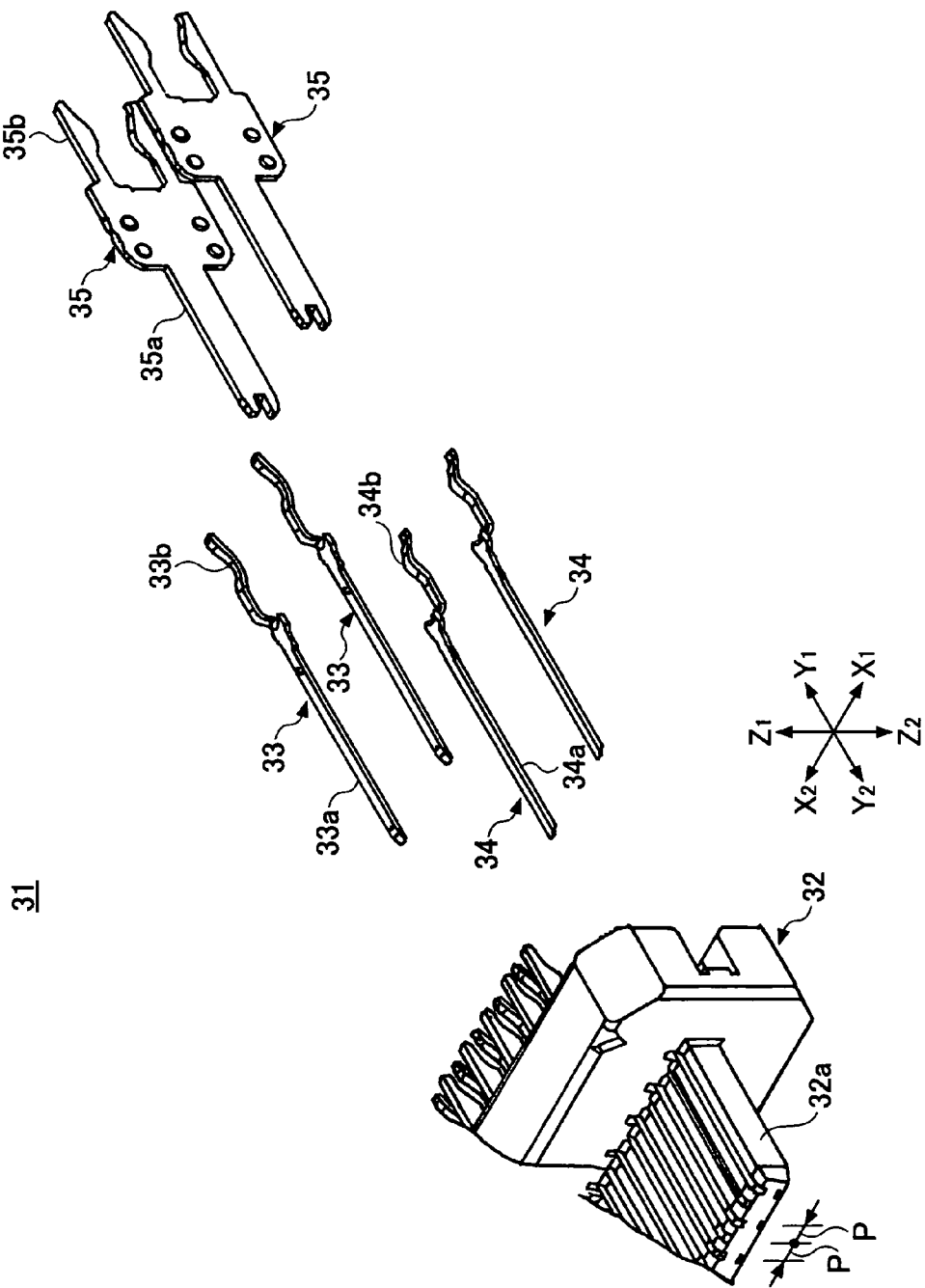
FIG. 5 is an exploded perspective view showing a contact assembly.

Referring back to FIGS. 8 through 11, the Y2 side end of the relay board 200 is fitted in the Y1 side of the contact assembly 31. The contact connection pads 51 through 58 (FIG. 6A) are soldered to the first finger sections 33b of the first signal contacts 33 (FIG. 5), and the contact connection pads 91 through 98 (FIG. 6B) are soldered to the second finger sections 34b of the second signal contacts 34. A part of each ground pattern 330 and 331 (FIGS. 12, 13) is soldered to the fork sections 35b of the ground contacts 35. In this way, the wire connection pads 221 and 222 are connected to the signal output contact pair (1)(FIG. 11); the wire connection pads 223 and 224 are connected to the signal output contact pair (2); the wire connection pads 225 and 226 are connected to the signal output contact pair (3); the wire connection pads 227 and 228 are connected to the signal output contact pair (4); the wire connection pads 241 and 242 are connected to the signal input contact pair (5); the wire connection pads 243 and 244 are connected to the signal input contact pair (6); the wire connection pads 245 and 246 are connected to the signal input contact pair (7); and the wire connection pads 247 and 248 are connected to the signal input contact pair (8)

The pair wires 141 through 144 at the end of the cable 130 are aligned in the X1-X2 direction at the Y-1 side end on the upper face of the relay board 200. The first and second signal wires 133-1 and 133-2 of the pair wire 141 are respectively soldered to the wire connection pads 221 and 222 with solders 290. Likewise, the first and second signal wires of the pair wire 142 are respectively soldered to the wire connection pads 223 and 224; the first and second signal wires of the pair wire 143 are respectively soldered to the wire connection pads 225 and 226; and the first and second signal wires of the pair wire 144 are respectively soldered to the wire connection pads 227 and 228. The pair wires 145 through 148 are aligned in the X1-X2 direction at the Y-1 side end on the lower face of the relay board 200. The first and second signal wires 133-1 and 133-2 of the pair wire 145 are respectively soldered to the wire connection pads 241 and 242 with solders 291. Likewise, the first and second signal wires of the pair wire 146 are respectively soldered to the wire connection pads 243 and 244; the first and second signal wires of the pair wire 147 are respectively soldered to the wire connection pads 245 and 246; and the first and second signal wires of the pair wire 148 are respectively soldered to the wire connection pads 247 and 248.

The signal output contact pair (1) of the contact assembly 31 is electrically connected to the pair wire 141 through the contact connection pads 211 and 231 (FIGS. 12, 13), the wiring pattern 250, the wiring pattern 251, the via hole 252, the wiring pattern 253, and the wire connection pads 221 and 222. The signal output contact pair (2) of the contact assembly 31 is electrically connected to the pair wire 142 through the contact connection pads 212 and 232, the wiring pattern 260, the wiring pattern 261, the via hole 262, the wiring pattern 263, and the wire connection pads 223 and 224. The signal output contact pair (3) of the contact assembly 31 is electrically connected to the pair wire 143 through the contact connection pads 213 and 233, the wiring pattern 270, the wiring pattern 271, the via hole 272, the wiring pattern 273, and the wire connection pads 225 and 226. The signal output contact pair (4) of the contact assembly 31 is electrically connected to the pair wire 144 through the contact connection pads 214 and 234, the wiring pattern 280, the wiring pattern 281, the via hole 282, the wiring pattern 283, and the wire connection pads 227 and 228.

The signal input contact pair (5) of the contact assembly 31 is electrically connected to the pair wire 145 through the contact connection pads 215 and 235, the wiring pattern 290, the via hole 291, the wiring pattern 292, the wiring pattern 293, and the wire connection pads 241 and 242. The signal input contact pair (6) of the contact assembly 31 is electrically connected to the pair wire 146 through the contact connection pads 215 and 217, the wiring pattern 300, the via hole 301, the wiring pattern 302, the wiring pattern 303, and the wire connection pads 243 and 244. The signal input contact pair (7) of the contact assembly 31 is electrically connected to the pair wire 147 through the contact connection pads 217 and 237, the wiring pattern 310, the via hole 311, the wiring pattern 312, the wiring pattern 313, and the wire connection pads 245 and 246. The signal input contact pair (8) of the contact assembly 31 is electrically connected to the pair wire 148 through the contact connection pads 218 and 238, the wiring pattern 320, the via hole 321, the wiring pattern 322, the wiring pattern 323, and the wire connection pads 247 and 248.

In short, the pair wires 141 through 144 are respectively connected to the signal output contact pairs (1) through (4), and the pair wires 145 through 148 are respectively connected to the signal input contact pairs (5) through (8).

Referring to FIG. 14, the first and second signal wires 133-1 and 133-2 of the respective signal output pair wires 141 through 144 are shielded from the first and second signal wires 133-1 and 133-2 of the respective signal input pair wires 145 through 148 by the two ground layers 201 and 202 therebetween. This configuration prevents occurrence of crosstalk between output signals and input signals.

[Embodiment 2]

Figure 15:
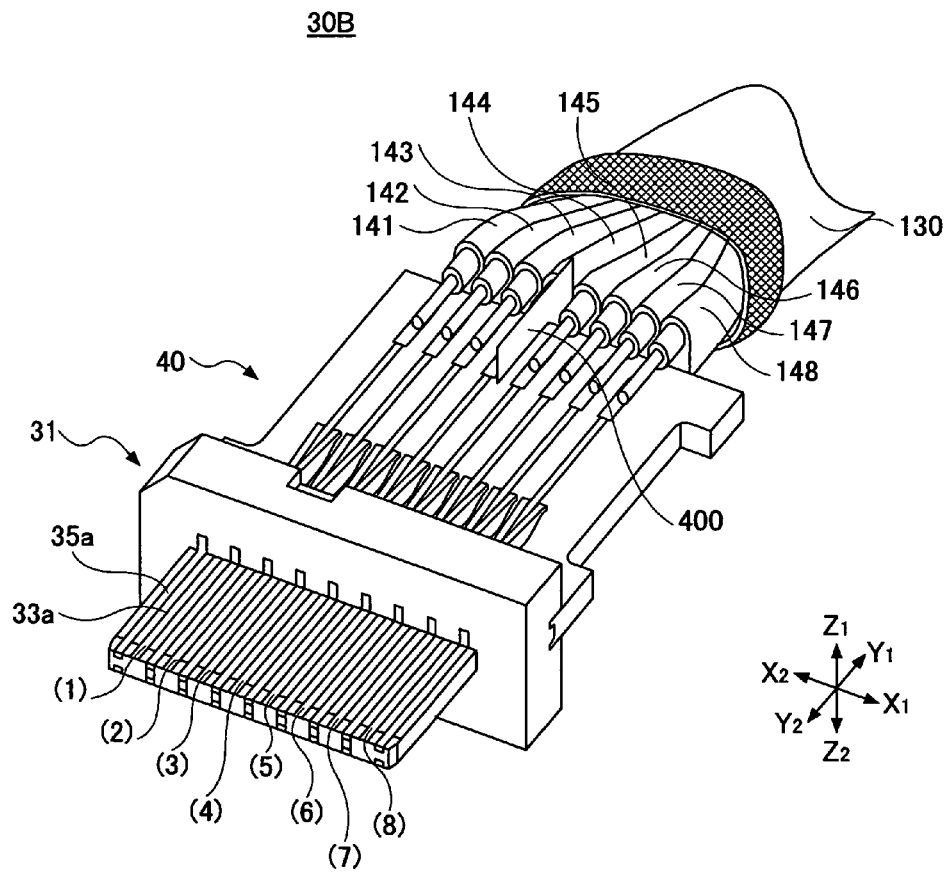
FIG. 15 is a perspective view showing a balanced transmission cable connector with a shield cover removed according to an embodiment 2 of the present invention.
Figure 16:
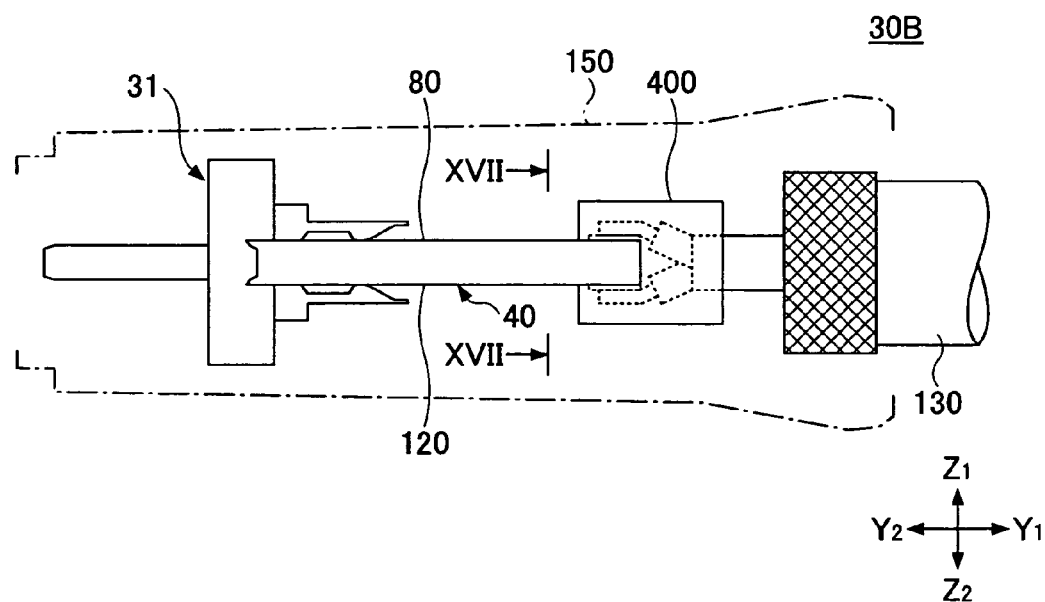
FIG. 16 is a side elevational view showing the balanced transmission cable connector of FIG. 15.
Figure 17:
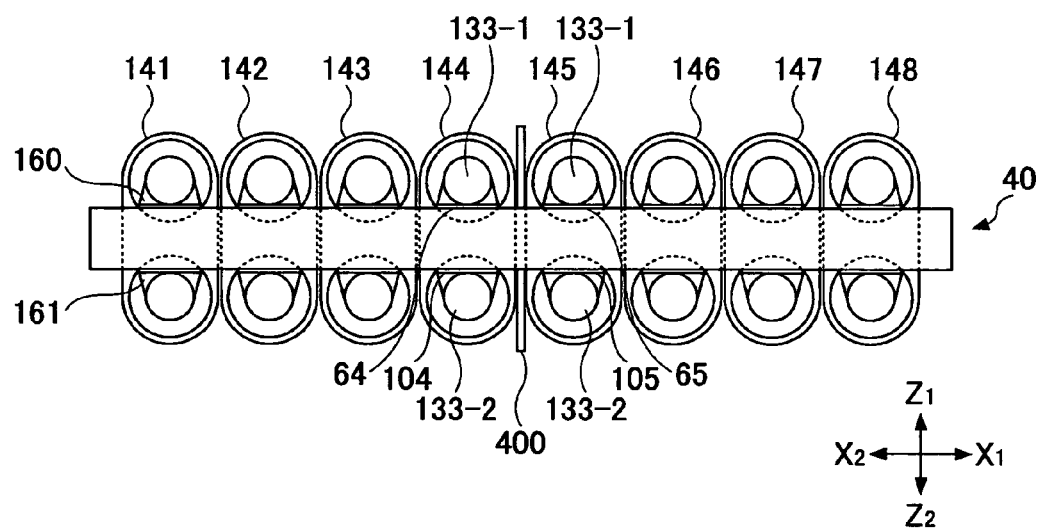
FIG. 17 is a cross-sectional view taken along line XVII—XVII in FIG. 16, showing pair wires arranged in line, connected to a relay board, and shielded by a shield member.

FIGS. 15 and 16 are illustrations each showing a part of a balanced transmission cable connector 30B according to an embodiment 2 of the present invention.

Figure 1:
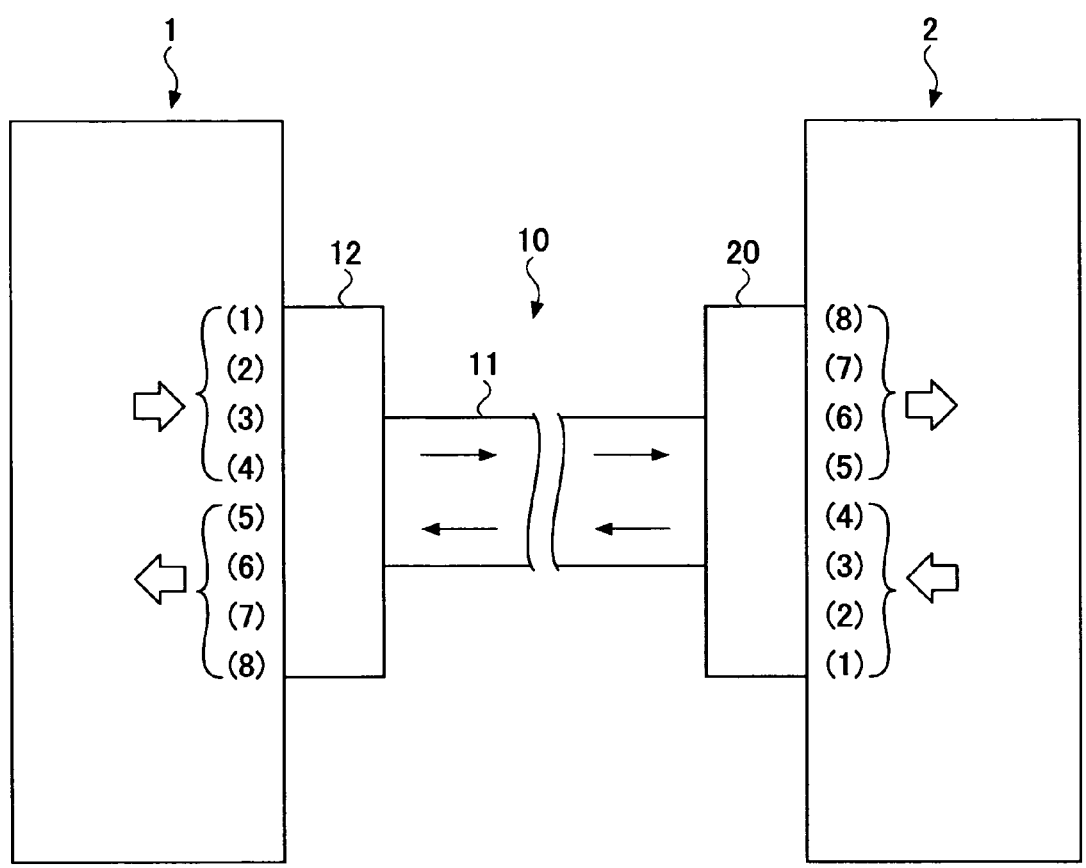
FIG. 1 is an illustration showing an example of use of a balanced transmission cable connector.
Figure 2A:
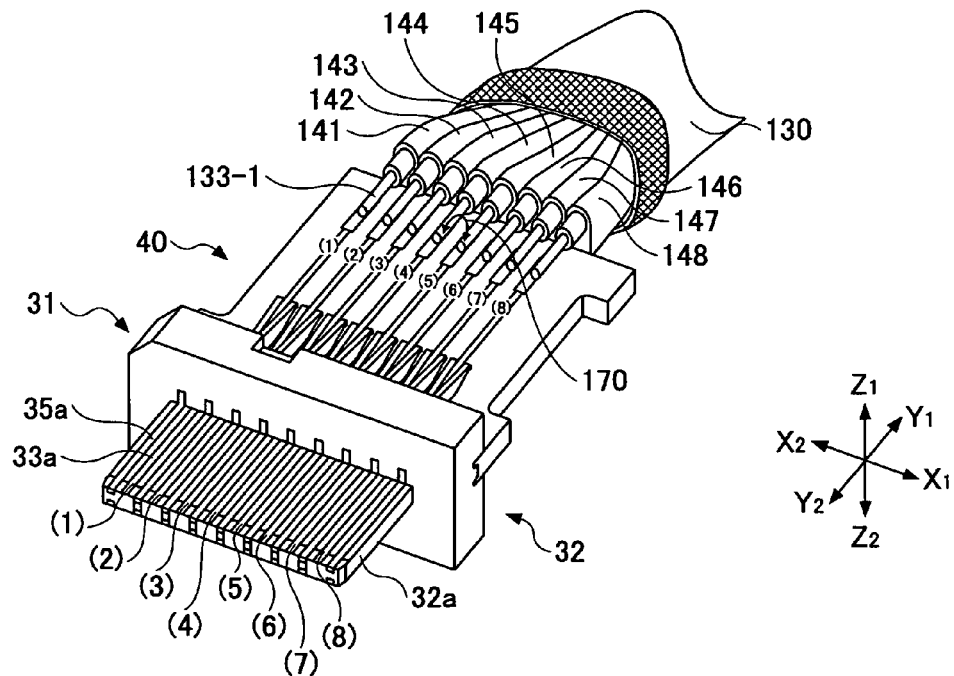
FIGS. 2A and 2B are perspective views each showing a related-art balanced transmission cable connector with a shield cover removed.
Figure 2B:
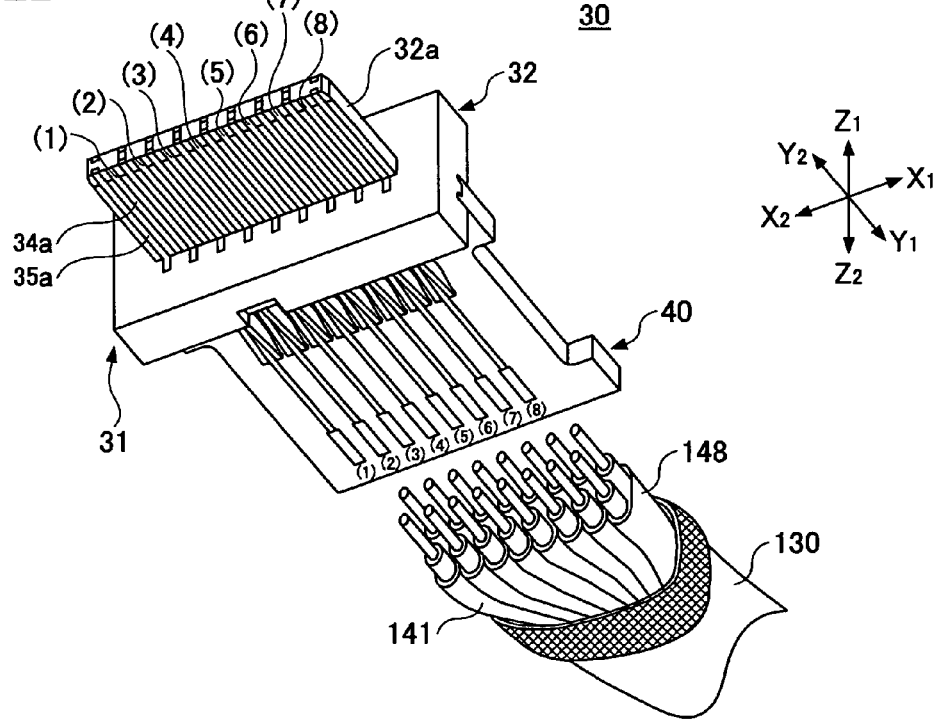
Figure 3:
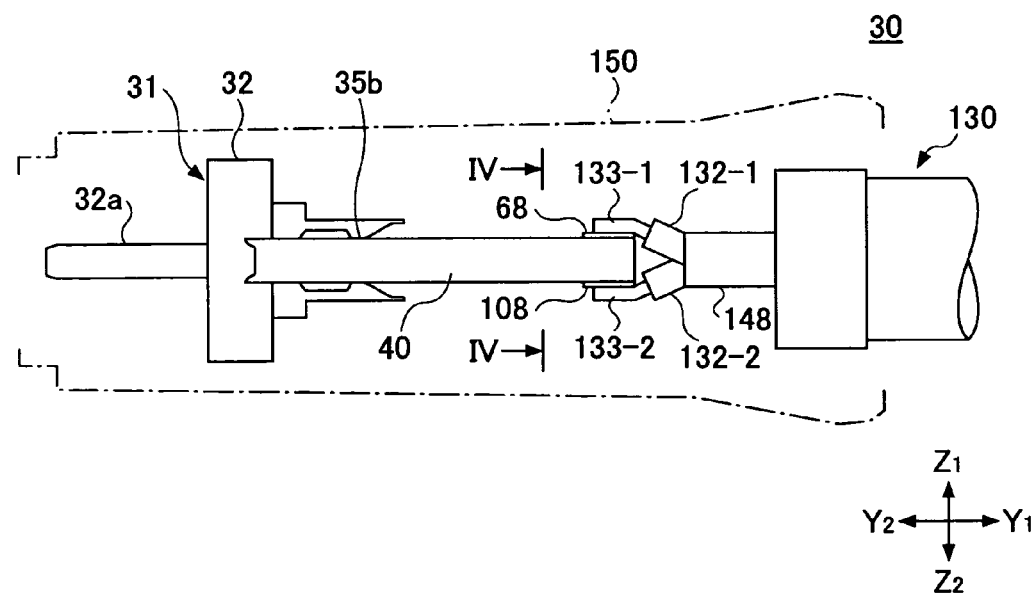
FIG. 3 is a side elevational view showing the related-art balanced transmission cable connector.
Figure 4:
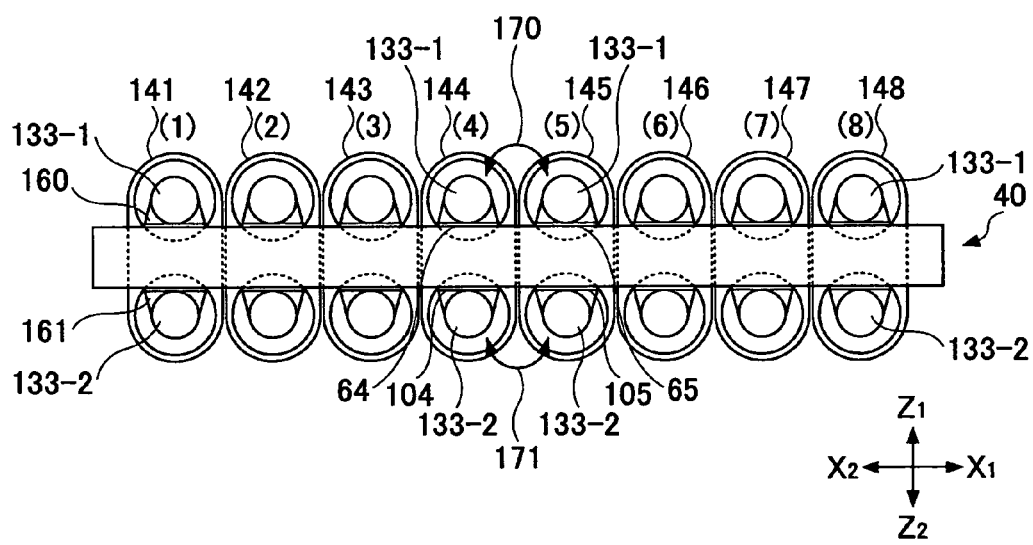
FIG. 4 is a cross-sectional view taken along line IV—IV in FIG. 3, showing pair wires arranged in line and connected to a relay board.

The cable connector 30B is substantially the same as the cable connector 30 shown in FIGS. 2A and 2B except having a shield member 400.

Figure 18:
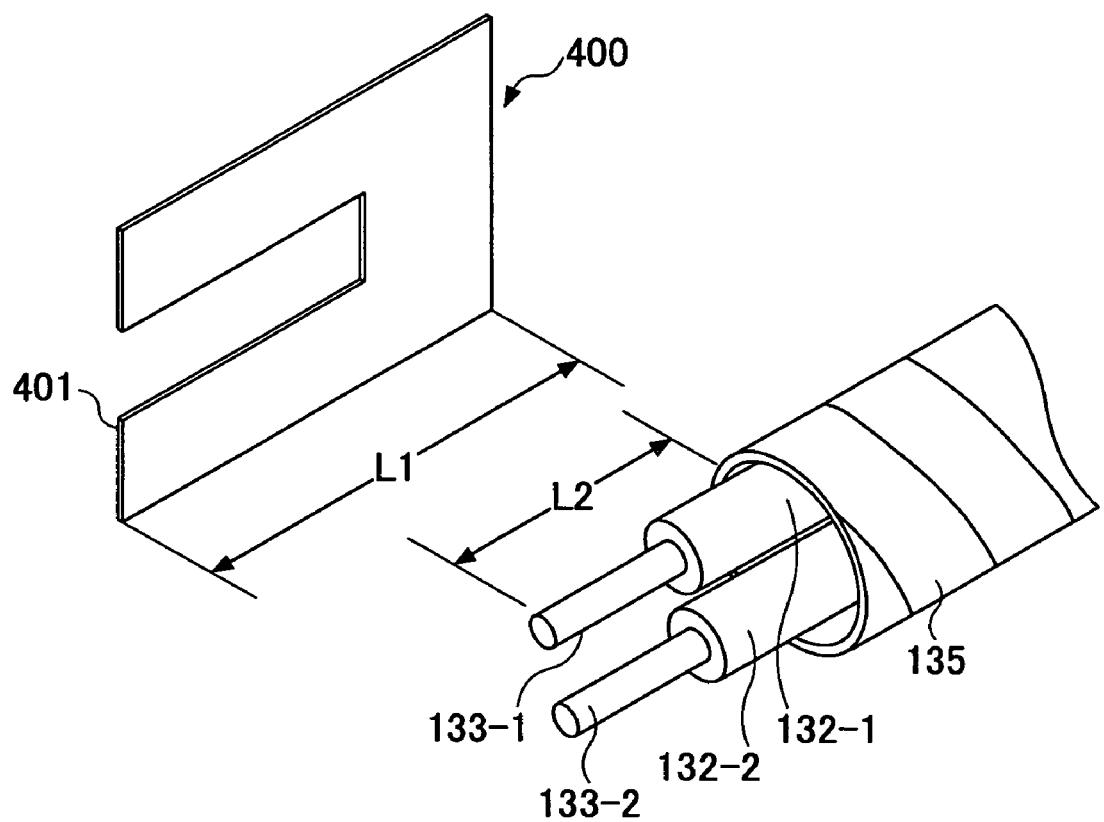
FIG. 18 is an illustration showing the shield member.

The shield member 400, as shown in FIG. 18 in detail, has a clamp section 401 for clamping a relay board 40. The length L1 of the shield member 400 is longer than the length L2 of the part of first and second shielded signal wires 132-1 and 132-2 extending out of an end of a metal tape 135.

The shield member 400 is mounted between a signal output pair wire 144 and a signal input pair wire 145 adjacent thereto. The clamp section 401 is arranged to fit and clamp the Y1 side end of the relay board 40 so that the shield member 400 is electrically connected to ground patterns 80 and 120.

The shield member 400 shields between the shielded first and second signal wires 132-1 and 132-2 extending out of the end of the metal tape 135 of the signal output pair wire 144 and the first and second shielded signal wires 132-1 and 132-2 extending out of the end of the metal tape 135 of the signal input pair wire 145. This configuration prevents occurrence of crosstalk between output signals passing through the pair wire 144 and input signals passing through the pair wire 145.

The shield member 400 is also applicable to the cable connector 30A in FIG. 8.

The present application is based on

Japanese Priority Application No. 2004-253119 filed on Aug. 31, 2004, with the Japanese Patent Office, the entire contents of which are hereby incorporated by reference.

What is claimed is:

1. A balanced transmission cable connector, comprising:
a contact assembly having an electrical insulating block body, and a group of contacts forming plural signal input contact pairs to input signals and a group of contacts forming plural signal output contact pairs to output signals arranged in the block body so as to allow balanced transmission;
a cable having plural shielded pair wires each pair wire having two wires extending out of an end thereof; and
a relay board mounted on the rear side of the contact assembly, the relay board having contact connection pads on an upper face thereof and contact connection pads paired therewith on a lower face thereof that are arranged at one side and are respectively connected to the contacts, wire connection pads that are arranged at the other side and are respectively connected to the wires extending out of the end of the respective pair wires of the cable, a wiring pattern to connect the contact connection pads and the wire connection pads, and a ground layer therein side,
wherein the wires connected to the contacts of the signal output contact pairs are connected to the wire connection pads situated on the upper face of said relay board and the wires connected to the contacts of the signal input contact pairs are connected to the wire connection pads situated on the lower face of said relay board, said ground layer shielding between the wires connected to the contacts of the signal output contact pairs and the wires connected to the contacts of the signal input contact pairs.

2. The balanced transmission cable connector as claimed in claim 1,
wherein the wire connection pads connected through the contact connection pads to the signal output contact pairs are disposed side by side on either one of the upper face or the lower face of the relay board, and the wire connection pads connected through the contact connection pads to the signal input contact pairs are disposed side by side on the other face of the relay board,
the two wires of the respective pair wires are connected to a pair of the signal output wire connection pads disposed side by side or a pair of the signal input wire connection pads disposed side by side, and
the shield part is the ground layer inside the relay board.

3. The balanced transmission cable connector as claimed in claim 1,
wherein the shield part is a plate shield member with the length greater than the length of the wires extending out of the end of the respective pair wires, having a clamp section to clamp an end of the relay board, and
the shield member having the clamp section to clamp the end of the relay board is electrically connected to a ground pattern on the upper face of the relay board and is disposed to face the wires connected to the relay board.

4. A balanced transmission cable connector, comprising:
a contact assembly having an electrical insulating block body, and a group of contacts forming plural signal input contact pairs to input signals and a group of contacts forming plural signal output contact pairs to output signals arranged in the block body so as to allow balanced transmission;
a cable having plural shielded pair wires each pair wire having two wires extending out of an end thereof; and
a relay board mounted on the rear side of the contact assembly, the relay board having contact connection pads on an upper face thereof and contact connection pads paired therewith on a lower face thereof that are arranged at one side and are respectively connected to the contacts, wire connection pads that are arranged at the other side and are respectively connected to the wires extending out of the end of the respective pair wires of the cable, a wiring pattern to connect the contact connection pads and the wire connection pads, and a ground layer therein side;
wherein the wiring pattern is formed in a fan shape spreading from the side where the contact connection pads are arranged to the side where the wire connection pads are arranged,
the wire connection pads connected through the contact connection pads to the signal output contact pairs are disposed side by side on the upper face of the relay board, and the wire connection pads connected through the contact connection pads to the signal input contact pairs are disposed side by side on the lower face of the relay board,
the two wires of the respective pair wires are connected to a pair of the signal output wire connection pads disposed side by side or a pair of the signal input wire connection pads disposed side by side, and
the ground layer inside the relay board is configured to shield between the wires connected to the signal output wire connection pads and the wires connected to the signal input wire connection pads.

5. A balanced transmission cable connector comprising:
a contact assembly having an electrical insulating block body, and a group of contacts forming plural signal input contact pairs to input signals and a group of contacts forming plural signal output contact pairs to output signals arranged in the block body so as to allow balanced transmission;
a cable having plural shielded pair wires each pair wire having two wires extending out of an end thereof; and
a relay board mounted on the rear side of the contact assembly, the relay board having contact connection pads on an upper face thereof and contact connection pads paired therewith on a lower face thereof that are arranged at one side and are respectively connected to the contacts, wire connection pads that are arranged at the other side and are respectively connected to the wires extending out of the end of the respective pair wires of the cable, a wiring pattern to connect the contact connection pads and the wire connection pads, and a ground layer therein side;
wherein the wiring pattern is formed in a fan shape spreading from the side where the contact connection pads are arranged to the side where the wire connection pads are arranged,
the wire connection pads connected through the contact connection pads to the signal output contact pairs are disposed side by side on either one of the upper face or the lower face of the relay board, and the wire connection pads connected through the contact connection pads to the signal input contact pairs are disposed side by side on the other face of the relay board,
the two wires of the respective pair wires are connected to a pair of the signal output wire connection pads disposed side by side or a pair of the signal input wire connection pads disposed side by side, and
the ground layer inside the relay board is configured to shield between the wires connected to the signal output wire connection pads and the wires connected to the signal input wire connection pads;
wherein the wiring pattern formed in a fan shape on the relay board includes a first wiring pattern extending on either one of the upper face or the lower face of the relay board, and a second wiring pattern extending on both of the upper face and lower face of the relay board through via holes, and
each pair of the contact connection pads disposed on the upper face and the lower face is connected to a corresponding pair of the wire connection pads disposed on the same face through the first wiring pattern and the second wiring pattern.

6. The balanced transmission cable connector as claimed in claim 5, wherein the plural pairs of wire connection pads on the upper face of the relay board and the plural pairs of wire connection pads on the lower face of the relay board are arranged in the same direction as the contact connection pads.

* * * * *

UNITED STATES PATENT AND TRADEMARK OFFICE
CERTIFICATE OF CORRECTION

PATENT NO. : 7,052,311 B2 Page 1 of 1
APPLICATION NO. : 11/069946
DATED : May 30, 2006
INVENTOR(S) : Takahiro Kondou It is certified that error appears in the above-identified patent and that said Letters Patent is hereby corrected as shown below:

Column 10, Line 31, change "therein side," to --thereinside,--.

Column 11, Line 20, change "therein side;" to --thereinside;--.

Column 11, Line 40, change "connector" to --connector,--.

Column 12, Line 9, "therein side;" to --thereinside;--.

Signed and Sealed this

Fourteenth Day of November, 2006

JON W. DUDAS
*Director of the United States Patent and Trademark Office*